(12) United States Patent
Zhang et al.

(10) Patent No.: US 9,640,593 B2
(45) Date of Patent: May 2, 2017

(54) TOUCH ORGANIC LIGHT EMITTING DIODE DISPLAY DEVICE AND MANUFACTURING METHOD THEREOF

(71) Applicant: BOE TECHNOLOGY GROUP CO., LTD., Beijing (CN)

(72) Inventors: Wenlin Zhang, Beijing (CN); Zhanfeng Cao, Beijing (CN); Shuang Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/368,653

(22) PCT Filed: Dec. 17, 2013

(86) PCT No.: PCT/CN2013/089684
§ 371 (c)(1),
(2) Date: Jun. 25, 2014

(87) PCT Pub. No.: WO2015/043088
PCT Pub. Date: Apr. 2, 2015

(65) Prior Publication Data
US 2015/0162389 A1    Jun. 11, 2015

(30) Foreign Application Priority Data
Sep. 27, 2013  (CN) .......................... 2013 1 0452236

(51) Int. Cl.
*H01L 27/32* (2006.01)
*H01L 51/52* (2006.01)
(Continued)

(52) U.S. Cl.
CPC ............ *H01L 27/323* (2013.01); *G06F 3/041* (2013.01); *H01L 27/3248* (2013.01);
(Continued)

(58) Field of Classification Search
CPC ............... H01L 27/323; H01L 27/3248; H01L 27/3258; H01L 27/3272; H01L 27/3244;
(Continued)

(56) References Cited

U.S. PATENT DOCUMENTS

2008/0100592 A1\* 5/2008 Shigeno .................. G06F 3/044
345/174
2011/0050604 A1 3/2011 Kwon et al.
(Continued)

FOREIGN PATENT DOCUMENTS

CN    101162418 A    4/2008
CN    101609647 A    12/2009
(Continued)

OTHER PUBLICATIONS

International Search Report mailed Jun. 17, 2014; PCT/CN2013/089684.
(Continued)

*Primary Examiner* — Cuong B Nguyen
*Assistant Examiner* — Juanita Rhodes
(74) *Attorney, Agent, or Firm* — Ladas & Parry LLP

(57) ABSTRACT

A touch organic light emitting diode (OLED) display device, including: a thin film transistor formed on one side of a substrate, a touch signal feedback layer formed on the thin film transistor, a luminous substrate provided on the touch signal feedback layer, and a touch signal receiving layer formed on the other side of the substrate. An anode layer of the luminous substrate is connected to a drain electrode of the thin film transistor. As to the touch-sensitive OLED display device, a touch screen and an OLED display portion are prepared integratedly, so that the weight and thickness of the display itself are greatly reduced, and the production cost is saved. A manufacturing method of the touch-sensitive OLED display device is further disclosed.

17 Claims, 5 Drawing Sheets

(51) Int. Cl.
    *H01L 51/56*     (2006.01)
    *G06F 3/041*     (2006.01)

(52) U.S. Cl.
    CPC ...... *H01L 27/3258* (2013.01); *H01L 27/3272* (2013.01); *H01L 51/5206* (2013.01); *H01L 51/56* (2013.01); *H01L 27/3244* (2013.01); *H01L 2227/323* (2013.01)

(58) Field of Classification Search
    CPC   H01L 51/5206; H01L 51/56; H01L 2227/323
    See application file for complete search history.

(56) References Cited

U.S. PATENT DOCUMENTS

| | | | |
|---|---|---|---|
| 2012/0249454 A1* | 10/2012 | Teraguchi | G06F 3/0412 345/173 |
| 2013/0222317 A1 | 8/2013 | Abiru et al. | |
| 2015/0034918 A1* | 2/2015 | Yim | H01L 51/56 257/40 |
| 2015/0145816 A1* | 5/2015 | Ueda | C23C 14/083 345/174 |

FOREIGN PATENT DOCUMENTS

| | | | |
|---|---|---|---|
| CN | 102629611 | * 8/2012 | ......... H01L 27/1225 |
| CN | 102738199 A | 10/2012 | |
| CN | 203445126 A | 2/2014 | |
| JP | 2011-054962 A | 3/2011 | |

OTHER PUBLICATIONS

Written Opinion of the International Searching Authority mailed Jun. 17, 2014; PCT/CN2013/089684.
Second Chinese Office Action dated Aug. 31, 2015; Appln. No. 20130452236.4.
International Search Report dated May 13, 2014; PCT/CN2013/089684.
First Chinese Office Action dated Jul. 3, 2015; Appln. No. 201310452236.4.
Third Chinese Office Action dated Nov. 18, 2015; Appln. No. 201310452236.4.

* cited by examiner

TOUCH ORGANIC LIGHT EMITTING DIODE DISPLAY DEVICE AND MANUFACTURING METHOD THEREOF

TECHNICAL FIELD

Embodiments of the present invention relate to a touch organic light emitting diode (OLED) display device and a manufacturing method thereof.

BACKGROUND

With the rapid development of science and technology, tremendous changes have taken place for electronic products, and touch-control electronic products have obtained increasing concerns of people. These touch-control electronic products are not only space-saving, easy to carry, but also are operable directly by a user through a finger, a stylus or the like, comfortable to use, and very convenient. For example, as to personal digital assistants (PDAs), touch-control cell phones, portable notebook computers and the like that are common in the market at present, investments for touch control technology have been increased in the industry, and therefore touch devices certainly will have more and more applications in various fields in the future.

The display mode of an OLED display screen differs from the display mode of a conventional LCD (Liquid Crystal Display) in that: it does not need a backlight source, and an OLED is formed through ultra-thin coating layers of organic materials and a glass substrate. These organic materials can emit light when a current passes through them. Consequently, the characteristics of an OLED comprise self-luminous, thus its visibility and brightness are high. Secondly, an OLED has a low voltage requirement, and it is of energy saving and high efficiency. Because of fast response, light weight, small thickness, simple construction, low cost and other merits, OLEDs are regarded as one of the most promising products in the twenty-first Century.

Combination of the touch control technology and the OLED technology is bound to promote the development of display technology, and is also a trend of development of display in the future. For the touch structures of organic light emitting diode display devices at present, a touch screen and a display portion of an organic light emitting diode display device are mostly manufactured separately. This configuration increases the weight and thickness of a display itself, and is contrary to the advantages of light weight and slim profile possessed by the organic light emitting diode display device itself.

SUMMARY

According to embodiments of the invention, there are provided a touch organic light emitting diode display device and a manufacturing method thereof, so as to avoid such a problem of an existing organic light emitting diode display device that the weight and thickness of the display are increased due to the fact that a touch screen and a display portion of the organic light emitting diode display device are manufactured separately.

In an aspect of the invention, there is provided a touch organic light emitting diode display device, comprising: a thin film transistor formed on one side of a substrate, a touch signal feedback layer formed on the thin film transistor, a luminous substrate provided on the touch signal feedback layer, and a touch signal receiving layer formed on the other side of the substrate. An anode layer of the luminous substrate is connected to a drain electrode of the thin film transistor.

For example, a protection layer is formed on the thin film transistor; the touch signal feedback layer is formed on the protection layer; an interlayer insulation layer is formed on the touch signal feedback layer; a first via hole is provided in the interlayer insulation layer, a second via hole is provided in the protection layer, the anode layer is formed on the interlayer insulation layer, and is connected to the drain electrode of the thin film transistor through the first via hole and the second via hole.

For example, the luminous substrate includes the anode layer, and a luminous layer and a cathode layer that are formed on the anode layer in sequence.

For example, a thickness of the anode layer is in the range of 400 Å to 700 Å.

For example, each of the touch signal receiving layer and the touch signal feedback layer is made of at least one material selected from the group consisting of indium gallium zinc oxide, indium zinc oxide, indium tin oxide, and indium gallium tin oxide.

For example, a thickness of the touch signal receiving layer is in the range of 400 Å to 700 Å; and for example, a thickness of the touch signal feedback layer is in the range of 400 Å to 700 Å.

For example, a material for the protection layer is SiOx or SiNx.

In another aspect of the invention, there is further provided a manufacturing method of a touch organic light emitting diode display device, comprising: forming a pattern of a touch signal receiving layer on one side of a substrate; forming a pattern of a thin film transistor comprising a drain electrode on the other side of the substrate; forming a pattern of a touch signal feedback layer on the thin film transistor; forming a pattern of a luminous substrate comprising an anode layer on the touch signal feedback layer, the anode layer being connected to the drain electrode.

For example, a pattern of a protection layer with a second via hole is formed on a source electrode and the drain electrode of the thin film transistor; a pattern of the touch signal feedback layer is formed on the protection layer; an interlayer insulation layer with a first via hole is formed on the touch signal feedback layer; a pattern of the anode layer is formed on the interlayer insulation layer, and the anode layer is connected to the drain electrode through the first via hole and the second via hole.

For example, a pattern of a luminous layer and a pattern of a cathode layer are formed on the anode layer through patterning processes sequentially.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

REFERENCE NUMERALS

Figure 1:
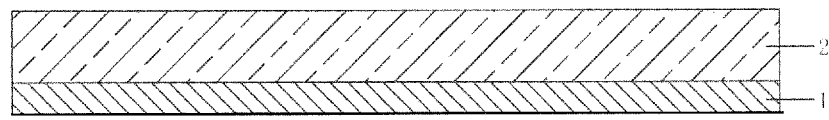
FIG. 1 is a structurally schematic view illustrating a touch organic light emitting diode display device after a first patterning process in Embodiment 1 of the invention.

1: touch signal receiving layer; 2: substrate; 3: gate electrode; 4: gate insulation layer; 5: active layer; 6: barrier layer; 71: source electrode; 72: drain electrode; 8: protection layer; 9: touch signal feedback layer; 10: interlayer insulation layer 11: anode layer; 12: luminous layer; 13: cathode layer; 14: buffer layer; 15: planarization layer; A: thin film transistor; B: luminous substrate C: external general control circuit

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Embodiment 1

As illustrated in FIGS. 1 to 13, a touch organic light emitting diode display device provided by Embodiment 1 has a bottom-gate structure. As illustrated in FIG. 13, the touch organic light emitting diode display device includes a thin film transistor A formed on one side of a substrate 2 with a touch signal feedback layer 9 formed thereon. A luminous substrate B is provided on the touch signal feedback layer 9, for example, an anode layer 11 of the luminous substrate B is connected to a drain electrode 72 of the thin film transistor A, and a touch signal receiving layer 1 is formed on the other side of the substrate 2.

The touch organic light emitting diode display device according to the embodiment includes a pixel array defined by gate lines, data lines (as well as power lines), and each pixel in the array has at least one thin film transistor functioning as a switch element and a drive element and an organic light emitting diode functioning as a luminous element. As desired, the organic light emitting diode can emit red light, green light, blue light, white light, or the like for example.

With, respect to the touch organic light emitting diode display device according to the embodiment, by means of forming the touch signal receiving layer 1 on one side of the substrate 2, forming the touch signal feedback layer 9 on the thin film transistor A, and connecting the anode layer 11 of the luminous substrate B to the drain electrode 72 of the thin film transistor A, provision of the touch signal feedback layer 9 within the thin film transistor A is realized, the configuration in which a touch screen and an OLED display portion are formed into one body is realized, and the weight and thickness of the display itself are greatly reduced.

Figure 12:
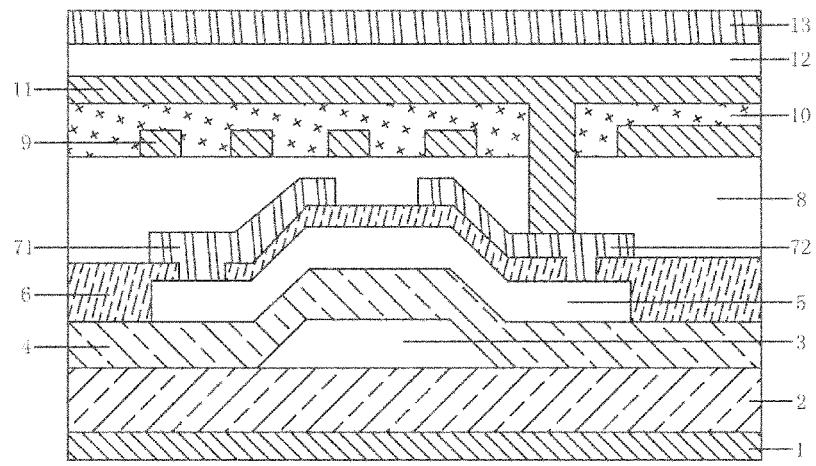
FIG. 12 is a structurally schematic view illustrating a touch organic light emitting diode display device after a twelfth patterning process in Embodiment 1 of the invention.
Figure 13:
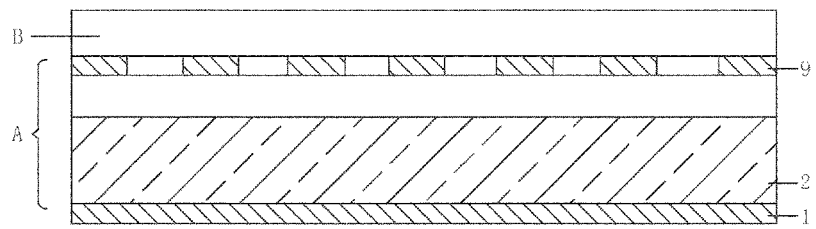
FIG. 13 is a simplified schematical section view after simplification illustrating a touch organic light emitting diode display device according to an embodiment of the invention.

As illustrated in FIG. 12, the thin film transistor includes: a gate electrode 3 formed on the substrate 2; a gate insulation layer 4 that covers the gate electrode 3 and extends to the top of the substrate 2; an active layer 5 that is formed on the gate insulation layer 4 and located over the gate electrode 2; a barrier layer 6 that covers the active layer 5 and extends to the top of the gate insulation layer 4; and a source electrode 71 and a drain electrode 72 that are formed on the barrier layer 6 and connected to the active layer. A protection layer 8 is formed on the source electrode 71 and the drain electrode 72; the touch signal feedback layer 9 is formed on the protection layer 8; an interlayer insulation layer 10 is formed on the touch signal feedback layer 9; a first via hole is provided in the interlayer insulation layer 10, a second via hole is provided in the protection layer 8, the anode layer 11 is formed on the interlayer insulation layer 10, and is connected to the drain electrode 72 of the thin film transistor A through the first via hole and the second via hole; and a luminous layer and a cathode layer are formed on the anode layer 11 in sequence. The anode layer 11, the luminous layer and the cathode layer constitute an organic light emitting diode.

FIGS. 1 to 12 are schematic views illustrating a manufacturing method of a touch organic light emitting diode display device according to an embodiment of the invention, and can be used to illustrate the technical solution of the embodiment further more. In the following descriptions, a patterning process referred to herein includes photoresist coating, masking, exposure, etching, photoresist stripping and other processes, and a positive photoresist will be given as an example of the photoresist.

For example, a transparent, alkali-free glass substrate or a quartz substrate may be used for the substrate 2, or other transparent substrate of certain hardness may be used.

The touch organic light emitting diode display device in Embodiment 1 is formed by using patterning process procedures, and the flow corresponding to the patterning processes will be described as follows.

Step 1, as illustrated in FIG. 1, a touch signal receiving layer 1 is sputtered on one side of a cleaned substrate 2, for example, it may be made of at least one material selected from the group consisting of indium gallium zinc oxide, indium zinc oxide, indium tin oxide, and indium gallium tin oxide. For example, it is made of nanometer Indium Tin Oxide (ITO), and its thickness can be controlled to such as the range of 400 Å to 700 Å. After photoresist-coating, exposure, development, wet etching and stripping, an ITO pattern in the touch signal receiving layer is completed.

Figure 2:
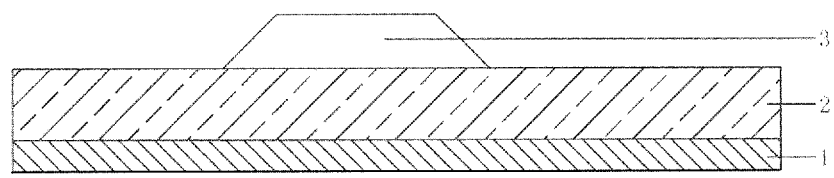
FIG. 2 is a structurally schematic view illustrating a touch organic light emitting diode display device after a second patterning process in Embodiment 1 of the invention.

Step 2, as illustrated in FIG. 2, the substrate 2 prepared after the step 1 is overturned, and a gate electrode 3 is formed on the other side of the cleaned substrate 2 by way of magnetron sputtering or thermal evaporation. For example, Mo or AlNd/Mo may be chosen as its material, and its thickness may be controlled to such as the range of 2000 Å to 3000 Å. After photoresist-coating, exposure, development, wet etching and stripping, a gate pattern as the first layer of a rear panel is completed.

Figure 3:
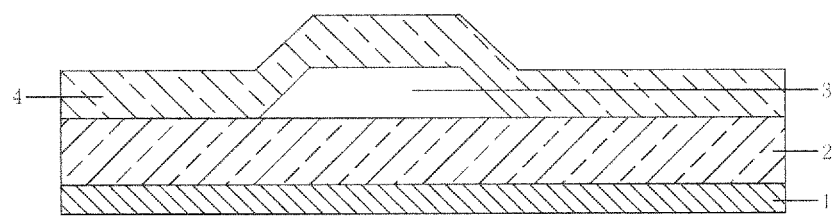
FIG. 3 is a structurally schematic view illustrating a touch organic light emitting diode display device after a third patterning process in Embodiment 1 of the invention.

Step 3, as illustrated in FIG. 3, a gate insulation layer 4 is deposited on the substrate 2 after step 2, so that the gate insulation layer 4 covers the gate electrode 3 and extends to the top of the substrate 2. For example, the gate insulation layer 4 employs SiOx or SiNx, and its thickness may be controlled to be about 4000 Å.

Figure 4:
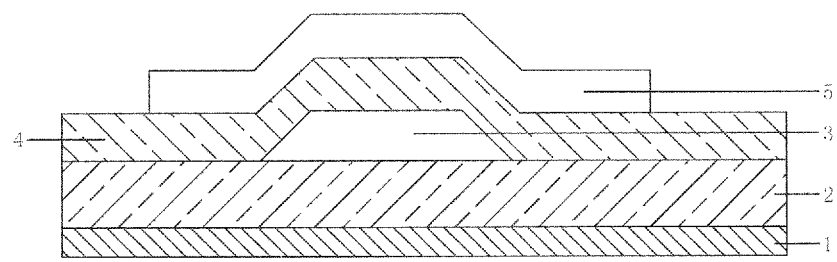
FIG. 4 is a structurally schematic view illustrating a touch organic light emitting diode display device after a fourth patterning process in Embodiment 1 of the invention.

Step 4, as illustrated in FIG. 4, an active layer 5 is formed on the substrate 2 after step 3 by sputtering. For example, it is made of indium gallium zinc oxide (IGZO), and the sputtering thickness is in the range of 40 nm to 60 nm. After photoresist-coating, exposure, development, wet etching, stripping and curing, preparation of the active layer 5 is completed. The material for the active layer 5 is not limited to an oxide semiconductor material such as IGZO, and it may also be such as amorphous silicon or the like.

Figure 5:
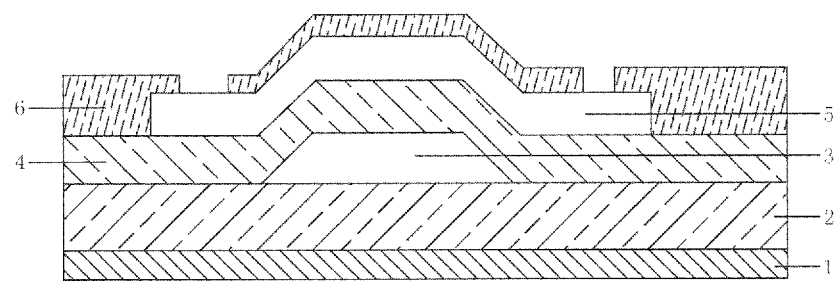
FIG. 5 is a structurally schematic view illustrating a touch organic light emitting diode display device after a fifth patterning process in Embodiment 1 of the invention.

Step 5, as illustrated in FIG. 5, a barrier layer 6 is deposited on the substrate 2 after step 4, so that the barrier layer 6 covers the active layer 5 and extends to the top of the gate insulation layer 4. For example, its material may be SiOx, and its thickness is controlled to be about 1000 Å. After the substrate is annealed for 1 h, it is subjected to photoresist-coating, exposure, development, wet etching and stripping, so that a contact via hole is formed.

Figure 6:
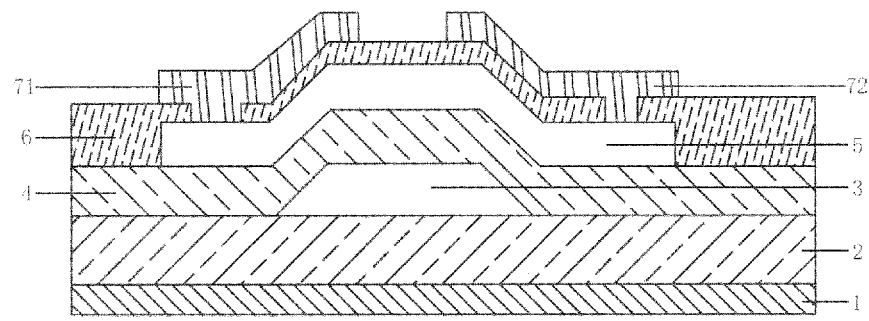
FIG. 6 is a structurally schematic view illustrating a touch organic light emitting diode display device after a sixth patterning process in Embodiment 1 of the invention.

Step 6, as illustrated in FIG. 6, a conductive layer for forming a source electrode 71 and a drain electrode 72 is sputtered on the substrate 2 after step 5, and after photoresist-coating, exposure, development, wet etching, and stripping are conducted, the pattern of the source electrode 71 and the drain electrode 72 is completed. For example, Mo or AlNd/Mo may be chosen as the material of the conductive layer for the source electrode 71 and the drain electrode 72, and its thickness is controlled to the range of 2000 Å to 3000 Å.

Figure 7:
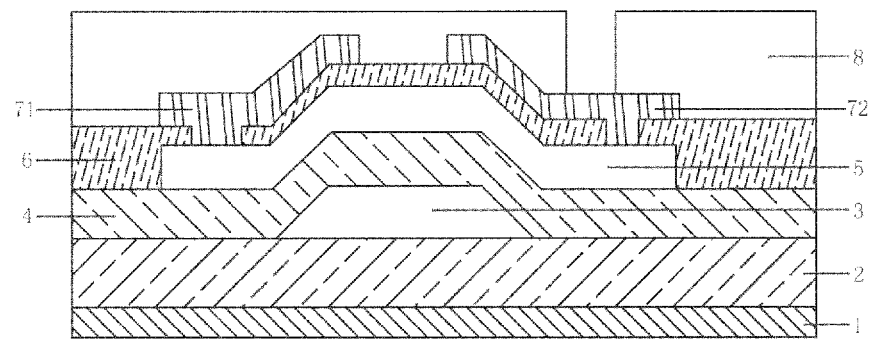
FIG. 7 is a structurally schematic view illustrating a touch organic light emitting diode display device after a seventh patterning process in Embodiment 1 of the invention.

Step 7, as illustrated in FIG. 7, photoresist is coated on the substrate 2 after step 6 so as to produce a protection layer 8. For example, the material for the protection layer may be SiOx or SiNx. Then, it is subjected to exposure and development, so as to form a second via hole.

Figure 8:
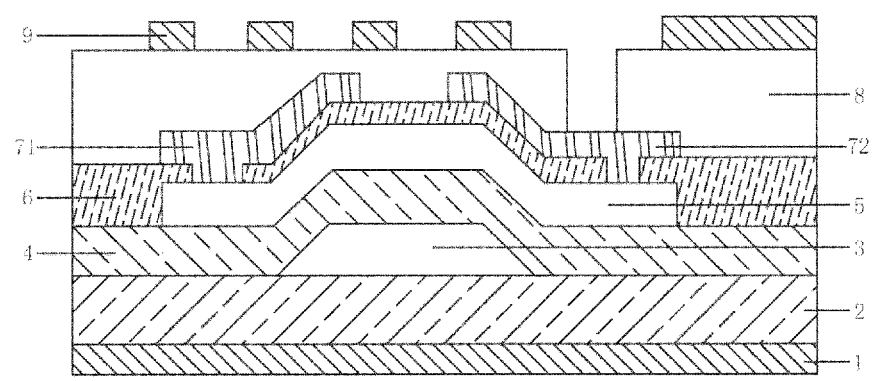
FIG. 8 is a structurally schematic view illustrating a touch organic light emitting diode display device after a eighth patterning process in Embodiment 1 of the invention.

Step 8, as illustrated in FIG. 8, a touch signal feedback layer 9 is sputtered on the substrate 2 after step 7. For example, it is made of at least one material selected from the group consisting of indium gallium zinc oxide, indium zinc oxide, indium tin oxide, and indium gallium tin oxide, and its thickness may be controlled to the range of 400 Å to 700 Å. After photoresist-coating, exposure, development, wet etching and stripping, pattern of the touch signal feedback layer is completed.

Figure 9:
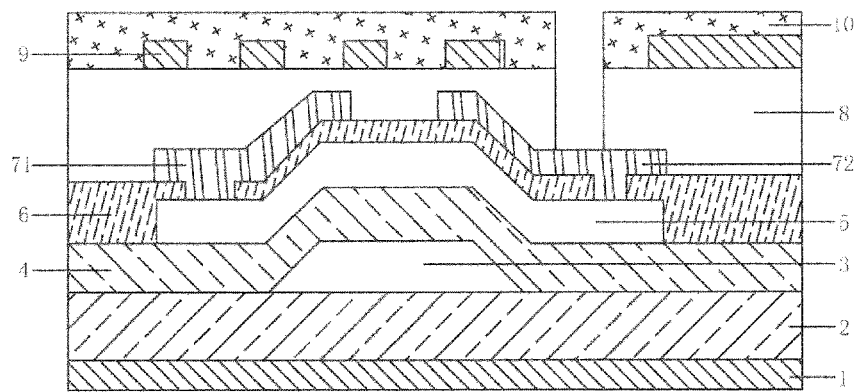
FIG. 9 is a structurally schematic view illustrating a touch organic light emitting diode display device after a ninth patterning process in Embodiment 1 of the invention.

Step 9, as illustrated in FIG. 9, an interlayer insulation layer 10 is produced on the substrate after step 8, and is subjected to curing, development and exposure, so that a first via hole is formed therein.

Figure 10:
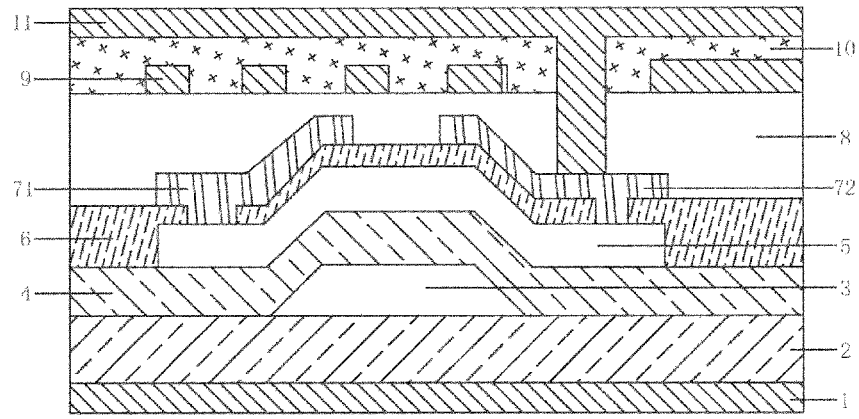
FIG. 10 is a structurally schematic view illustrating a touch organic light emitting diode display device after a tenth patterning process in Embodiment 1 of the invention.

Step 10, as illustrated in FIG. 10, an anode layer 11 is sputtered on the substrate 2 after step 9. For example, it is made of ITO, and its thickness is controlled to the range of 400 Å to 700 Å or so. After photoresist-coating, exposure, development, wet etching and stripping, an anode pattern is completed.

Figure 11:
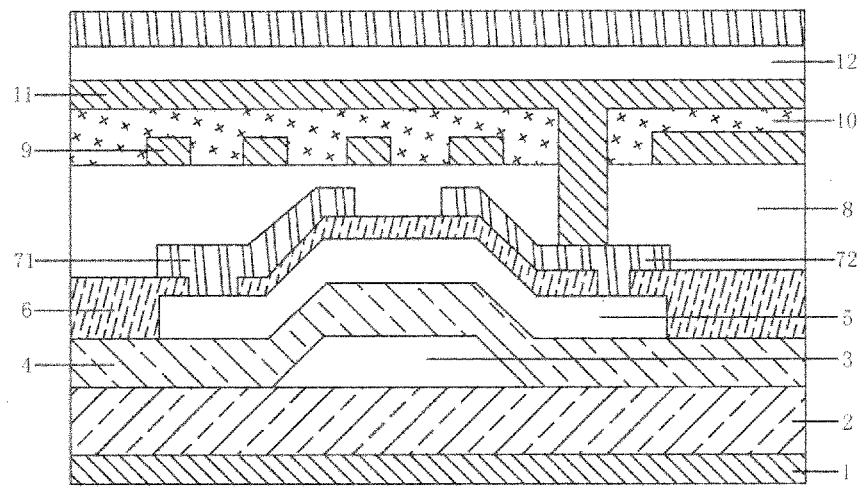
FIG. 11 is a structurally schematic view illustrating a touch organic light emitting diode display device after a eleventh patterning process in Embodiment 1 of the invention.

Step 11, as illustrated in FIG. 11, a luminous layer 12 is evaporated on the substrate 2 after step 10. The luminous layer 12 is an organic light emitting layer, and for example, it may further include a hole transportation layer (HTL), an electron transportation layer (ETL) or other functional layers.

Step 12, as illustrated in FIG. 12, a cathode layer 13 is evaporated on the substrate 2 after step 11. For example, it is made of a metal of a low work function, such as Ag, Al, Ca, In, Li, Mg or the like, or a composite metal of a low work function such as Mg—Ag.

Material selection for manufacture of an organic light emitting diode display device has broad flexibility, and embodiments of the invention have no limitation thereto.

Packaging is performed after the above steps, and after the packaging, the manufacture of the device is ended. Then through a subsequent circuit connection, a touch display can be realized.

As illustrated in FIG. 13, the touch signal receiving layer 1 is formed on one side of the substrate 2, the touch signal feedback layer 9 is formed over the thin film transistor A, and next, the luminous substrate B is further arranged on the thin film transistor A. Furthermore, the touch signal receiving layer 1 and the touch signal feedback layer 9 are connected through an external general control circuit, so that a touch display can be achieved.

Figure 14:
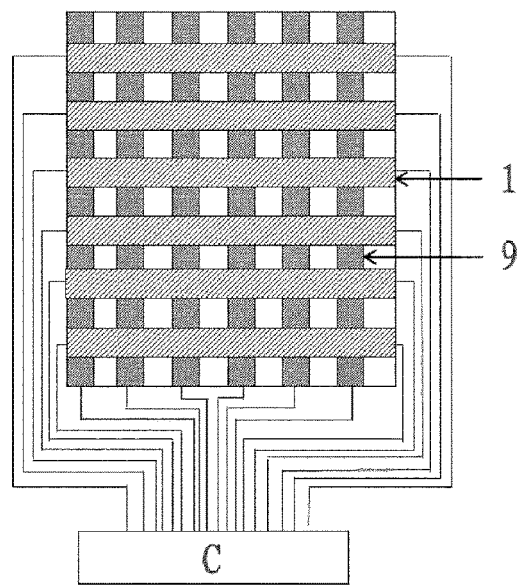
FIG. 14 is a schematic view illustrating orthogonally strip-like electrodes of touch electrodes according to an embodiment of the invention.

The operating principle of the touch-sensitive display according to the embodiment is as follows. An illustration of strip-like electrodes in the touch signal receiving layer 1 and the touch signal feedback layer 9 is given in FIG. 14. The touch signal receiving layer 1 can receive a pulse signal on axis X, and the touch signal feedback layer 9 can receive a pulse signal on axis Y. When a pulse signal on axis Y is applied to one column of touch electrodes of the touch signal feedback layer 9, other columns are grounded, and at the same time, sensing electrodes of the touch signal receiving layer 1 are detected row by row. When the touch-sensitive display is touched, the capacitance at the touch location is changed, and then an intersection point at the location where the capacitance is changed can be determined through the above scan detection. Which point on the touch screen is touched can be obtained by a control circuit C through algorithm calculation, and next, the result can be sent to such as a central processing unit (CPU) by the control circuit C to present a display position on the touch screen or to conduct a corresponding operation according to predefined settings, so as to achieve a touch purpose. When a finger contacts the touch screen, this is equivalent to a capacitance change, and the voltage or charge can be detected. Of course, the touch signal feedback layer may also be interchanged with the touch signal receiving layer. Namely, the touch signal feedback layer can also receive a pulse signal on axis X, and accordingly, a pulse signal on axis Y is applied to touch electrodes of the touch signal receiving layer, which configuration also can achieve the touch purpose.

Design patterns commonly used for the touch signal receiving layer 1 and the touch signal feedback layer 9 may be of a strip pattern, a diamond pattern or a triangle pattern, and the diamond pattern is relatively more common. It is generally required that an overlong connecting wiring between patterns be avoided upon design, and if the connecting wiring is overlong, then it leads to an overlarge line resistance, thereby prolonging the scan time. The diamond shapes in each row and in each column should be complete, and if the space permits, they can expand outward somewhat, so as to increase the sensitivity of edges. A half diamond shape can be used at the end of each row and each column, but the half diamond shape would not be too much, and in this way a problem that sensing areas in a row and in a column are not the same, which results in non-uniform scanning detection, can be avoided. A metal wire for connecting a touch pattern to the external general control circuit may be of a metal with a small line resistance such as nano silver, Al, Cu or the like, and its length may be controlled to the range of 50 um to 200 um.

Embodiment 2

Figure 15:
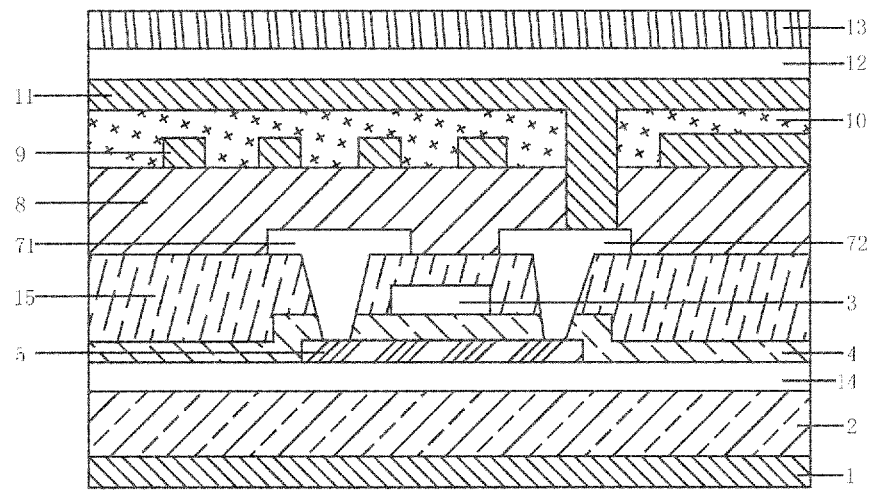
FIG. 15 is a structurally schematic view illustrating a touch organic light emitting diode display device in Embodiment 2 of the invention.

As illustrated in FIG. 15, a touch organic light emitting diode display device provided by Embodiment 2 of the invention has a top-gate structure.

The operational principle of the embodiment is the same as that of Embodiment 1. The touch organic light emitting diode display device according to Embodiment 2 includes: a touch signal receiving layer 1 formed on one side of a substrate 2; a buffer layer 14 formed on the other side of the substrate 2; an active layer 5 that is formed on the buffer layer 14; a gate insulation layer 4 that covers the active layer 5 and extends to the top of the buffer layer 14, with a contact via hole being provided in the gate insulation layer; a gate electrode 3 that is formed on the gate insulation layer 4 and located over the active layer 5; a planarization layer 15 that covers the gate electrode 3 and extends to the top of the gate insulation layer 4, with contact via holes being provided in an interlayer insulation layer 10; and a source electrode 71 and a drain electrode 72 formed on the interlayer insulation layer 10, which are connected to the active layer 5 through the contact via holes; and a protection layer 8 that covers the source electrode 71 and the drain electrode 72 and extends to the top of the interlayer insulation layer 10. The touch signal feedback layer 9 is formed on the protection layer 8; an interlayer insulation layer 10 is formed on the touch signal feedback layer 9; a first via hole is provided in the interlayer insulation layer 10, a second via hole is provided in the protection layer 8, the anode layer 11 is formed on the interlayer insulation layer 10, and is connected to the drain electrode 72 through the first via hole and the second via hole; and a luminous layer 12 and a cathode layer 13 are formed on the anode layer 11 in sequence.

The process of a manufacturing method in the embodiment is similar to that in Embodiment 1, and the process flow is as follows.

Step 1, a touch signal receiving layer 1 is sputtered on one side of a cleaned substrate 2, for example, it may be made of at least one material selected from the group consisting of indium gallium zinc oxide, indium zinc oxide, indium tin oxide, and indium gallium tin oxide. For example, it is made of nanometer ITO, and its thickness can be controlled to the range of 400 Å to 700 Å. After photoresist-coating, exposure, development, wet etching and stripping, an ITO pattern of the touch signal receiving layer is completed.

Step 2, the substrate 2 prepared after the step 1 is overturned, and a buffer layer 14 is sputtered on the other side of the cleaned substrate 2.

Step 3, an active layer 5 is partially formed on the substrate 2 after step 2 by sputtering. For example, it is made of IGZO, and the sputtering thickness is in the range of 40 nm to 60 nm. After photoresist-coating, exposure, development, wet etching, stripping and curing, preparation of the active layer is completed.

Step 4, a gate insulation layer 4 is deposited on the substrate 2 after step 3, so that the gate insulation layer 4 covers the active layer 5 and extends to the top of the buffer layer 14. For example, SiOx or SiNx is used for its material, and its thickness may be controlled to be about 4000 Å. After curing, development and exposure are conducted, contact via holes are formed therein.

Step 5, a gate electrode 3 is sputtered on the substrate 2 after step 4. For example, Mo or AlNd/Mo may be chosen as its material, and its thickness may be controlled to the range of 2000 Å to 3000 Å. After photoresist-coating, exposure, development, wet etching and stripping, a gate pattern as the first layer of a backplate is completed.

Step 6, a planarization layer 15 is formed on the substrate 2 after step 5, so that the interlayer insulation layer 10 covers the gate electrode 3 and extends to the top of the gate insulation layer 4. After it is subjected to curing, development, and exposure, ITO contact via holes are formed therein.

Step 7, a conductive layer for forming a source electrode 71 and a drain electrode 72 is sputtered on the substrate 2 after step 6, and after photoresist-coating, exposure, development, wet etching, and stripping are conducted, the pattern of the source electrode and the drain electrode is completed here. For example, the conductive layer may employ a substance such as Mo or AlNd/Mo, and its thickness is controlled to the range of 2000 Å to 3000 Å.

Step 8, photoresist is coated on the substrate 2 after step 7 so as to produce a protection layer 8. For example, the material for the protection layer may be SiOx or SiNx. Then, it is subjected to exposure and development, so as to form a second via hole therein.

Step 9, a touch signal feedback layer 9 is sputtered on the substrate 2 after step 8. For example, it can be made of at least one material selected from the group consisting of indium gallium zinc oxide, indium zinc oxide, indium tin oxide, and indium gallium tin oxide, and its thickness may be controlled to the range of 400 Å to 700 Å. After photoresist-coating, exposure, development, wet etching and stripping, the pattern of the touch signal feedback layer is completed.

Step 10, photoresist is coated on the substrate 2 after step 9 so as to prepare an interlayer insulation layer 10, and then it is subjected to exposure and development, so that a first via hole is formed therein.

Step 11, an anode layer 11 is sputtered on the substrate 2 after step 10. For example, it is made of ITO, and its thickness is controlled to the range of 400 Å to 700 Å or so. After photoresist-coating, exposure, development, wet etching and stripping, an anode pattern is completed.

Step 12, a luminous layer 12 is evaporated on the substrate 2 after step 11. The luminous layer 12 is an organic light emitting layer, and for example, it may further include a hole transportation layer (HTL), an electron transportation layer (ETL) or other functional layers.

Step 13, a cathode layer 13 is evaporated on the substrate 2 after step 12. For example, it is made of a metal of a low work function such as Ag, Al, Ca, In, Li, Mg or the like, or a composite metal of a low work function such as Mg—Ag.

Packaging can be performed after the above steps, and after the packaging, the manufacture of the device is ended. Then through a subsequent circuit connection, a touch display can be realized.

Additionally, it is to be noted that, the thin film transistor in embodiments of the invention may be a P-type field effect transistor or an N-type field effect transistor.

In summary, with respect to the touch-sensitive light emitting diode display device according to embodiments of the invention, which includes a thin film transistor formed on one side of a substrate, a touch signal feedback layer is formed on the thin film transistor, a luminous substrate is arranged on the touch signal feedback layer, an anode layer of the luminous substrate is connected to a drain electrode of the thin film transistor, and a touch signal receiving layer is formed on the other side of the substrate. In this way, the touch signal feedback layer is provided within the thin film transistor, and thus a touch screen and an OLED display portion can be prepared integratedly, thereby solving such a problem that a touch screen and an OLED display portion are produced separately. Consequently, weight and thickness of the display itself are greatly reduced, and production cost is saved.

Likewise, with the manufacturing method of the touch organic light emitting diode display device according to embodiments of the invention, a touch signal feedback layer is provided within a thin film transistor, simplifying the manufacturing steps, and saving the production cost. Furthermore, the thickness of a display device manufactured by this method is also decreased.

The foregoing are merely exemplary embodiments of the invention, but are not used to limit the protection scope of the invention. The protection scope of the invention is determined by attached claims.

The invention claimed is:

1. A touch organic light emitting diode display device, comprising:
    a thin film transistor formed on a first side of a substrate,
    a touch signal feedback layer formed on the thin film transistor,
    a luminous substrate provided on the touch signal feedback layer, an anode layer of the luminous substrate being connected to a drain electrode of the thin film transistor, the anode layer of the luminous substrate being disposed above the touch signal feedback layer while an entirety of the touch signal feedback layer is disposed above the drain electrode of the thin film transistor; and
    a touch signal receiving layer formed on a second side of the substrate.

2. The touch organic light emitting diode display device claimed as claim 1, further comprising:
    a protection layer formed on the thin film transistor, with the touch signal feedback layer being formed thereon; and
    an interlayer insulation layer formed on the touch signal feedback layer,
    wherein a first via hole is provided in the interlayer insulation layer, a second via hole is provided in the protection layer, the anode layer is formed on the interlayer insulation layer, and is connected to the drain electrode of the thin film transistor through the first via hole and the second via hole.

3. The touch organic light emitting diode display device claimed as claim 1, wherein the luminous substrate includes the anode layer, and a luminous layer and a cathode layer that are formed on the anode layer in sequence.

4. The touch organic light emitting diode display device claimed as claim 3, wherein a thickness of the anode layer is in a range of 400 Å to 700 Å.

5. The touch organic light emitting diode display device claimed as claim 1, wherein each of the touch signal receiving layer and the touch signal feedback layer is made of at least one material selected from a group consisting of indium gallium zinc oxide, indium zinc oxide, indium tin oxide, and indium gallium tin oxide.

6. The touch organic light emitting diode display device claimed as claim 5, wherein a thickness of the touch signal receiving layer is in a range of 400 Å to 700 Å.

7. The touch organic light emitting diode display device claimed as claim 5, wherein a thickness of the touch signal feedback layer is in a range of 400 Å to 700 Å.

8. The touch organic light emitting diode display device claimed as claim 2, wherein a material for the protection layer is SiOx or SiNx.

9. A manufacturing method of a touch organic light emitting diode display device, comprising:
    forming a pattern of a touch signal receiving layer on a first side of a substrate;
    forming a pattern of a thin film transistor comprising a drain electrode on a second side of the substrate;
    forming a pattern of a touch signal feedback layer on the thin film transistor; and
    forming a pattern of a luminous substrate comprising an anode layer on the touch signal feedback layer, the anode layer being connected to the drain electrode, the anode layer being disposed above the touch signal feedback layer while an entirety of the touch signal feedback layer is disposed above the drain electrode of the thin film transistor.

10. The manufacturing method of the touch organic light emitting diode display device claimed as claim 9, wherein,
    a pattern of a protection layer with a first via hole is formed on a source electrode and the drain electrode of the thin film transistor;
    the pattern of the touch signal feedback layer is formed on the protection layer;
    an interlayer insulation layer with a second via hole therein is formed on the touch signal feedback layer;
    a pattern of the anode layer is formed on the interlayer insulation layer, and the anode layer is connected to the drain electrode through the first via hole and the second via hole.

11. The manufacturing method of the touch organic light emitting diode display device claimed as claim 10, wherein a pattern of a luminous layer and a pattern of a cathode layer are formed on the anode layer through patterning processes sequentially.

12. The touch organic light emitting diode display device claimed as claim 2, wherein the luminous substrate includes the anode layer, and a luminous layer and a cathode layer that are formed on the anode layer in sequence.

13. The touch organic light emitting diode display device claimed as claim 12, wherein a thickness of the anode layer is in a range of 400 Å to 700 Å.

14. The touch organic light emitting diode display device claimed as claim 2, wherein each of the touch signal receiving layer and the touch signal feedback layer is made of at least one material selected from a group consisting of indium gallium zinc oxide, indium zinc oxide, indium tin oxide, and indium gallium tin oxide.

15. The touch organic light emitting diode display device claimed as claim 14, wherein a thickness of the touch signal receiving layer is in a range of 400 Å to 700 Å.

16. The touch organic light emitting diode display device claimed as claim 14, wherein a thickness of the touch signal feedback layer is in a range of 400 Å to 700 Å.

17. The touch organic light emitting diode display device claimed as claim 1, further comprising:
   a protection layer formed above the thin film transistor, with the touch signal feedback layer being formed above the protection layer; and
   an interlayer insulation layer formed above the touch signal feedback layer, with the anode layer being formed above the interlayer insulation layer;
   wherein a first via hole is provided in the interlayer insulation layer, a second via hole is provided in the protection layer, the anode layer is connected to the drain electrode of the thin film transistor through the first via hole and the second via hole.

\* \* \* \* \*